United States Patent
Kim et al.

(10) Patent No.: US 8,242,573 B2
(45) Date of Patent: Aug. 14, 2012

(54) SEMICONDUCTOR DEVICE WITH ISOLATION FORMED BETWEEN DIGITAL CIRCUIT AND ANALOG CIRCUIT

(75) Inventors: Han-Su Kim, Seoul (KR); Jin-Sung Lim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1041 days.

(21) Appl. No.: 12/007,185

(22) Filed: Jan. 8, 2008

(65) Prior Publication Data

US 2008/0164557 A1    Jul. 10, 2008

(30) Foreign Application Priority Data

Jan. 8, 2007   (KR) .................. 10-2007-0002110

(51) Int. Cl.
*H01L 29/06* (2006.01)
*H01L 21/76* (2006.01)

(52) U.S. Cl. ........ 257/503; 257/170; 257/398; 257/530; 257/E21.551; 257/E29.02; 438/123; 438/424; 438/433

(58) Field of Classification Search ............ 257/503, 257/530, E21.551, E29.02, 170, 398, 399, 257/400, 409, 484, 500, 501, 519; 438/103, 438/121, 123, 424, 433
See application file for complete search history.

(56) References Cited

U.S. PATENT DOCUMENTS

| 4,549,927 | A * | 10/1985 | Goth et al. ..................... 438/361 |
| 2004/0178430 | A1* | 9/2004 | Rhodes et al. ................. 257/292 |
| 2006/0012003 | A1* | 1/2006 | Mallikarjunaswamy et al. ............................. 257/501 |
| 2006/0060934 | A1* | 3/2006 | Lien et al. ..................... 257/499 |

FOREIGN PATENT DOCUMENTS

| JP | 63-076423 | 4/1988 |
| JP | 03-148852 | 6/1991 |
| JP | 10-012717 | 1/1998 |
| KR | 10-2001-0091035 | 10/2001 |
| KR | 10-2003-0059474 | 7/2003 |
| KR | 10-2004-0001862 | 1/2004 |
| KR | 10-2004-0023787 | 3/2004 |

* cited by examiner

*Primary Examiner* — Hung Vu
*Assistant Examiner* — Vernon P Webb
(74) *Attorney, Agent, or Firm* — Harness, Dickey & Pierce, P.L.C.

(57) ABSTRACT

There are provided a semiconductor device and a method of forming the same. The semiconductor device may include a semiconductor substrate including a digital circuit region and an analog circuit region, a device isolation layer on the boundary between the digital circuit region and the analog circuit region, a conductive region adjacent to the side surface and the bottom surface of the isolation layer, and a ground pad which is electrically connected to the conductive region and to which a ground voltage is applied.

18 Claims, 7 Drawing Sheets

SEMICONDUCTOR DEVICE WITH ISOLATION FORMED BETWEEN DIGITAL CIRCUIT AND ANALOG CIRCUIT

PRIORITY STATEMENT

This U.S. non-provisional patent application claims priority under 35 U.S.C §119 to Korean Patent Application No. 2007-02110, filed on Jan. 8, 2007, in the Korean Intellectual Property Office (KIPO), the entire contents of which are herein incorporated by reference.

BACKGROUND

1. Field

Example embodiments relate to semiconductor devices and methods of forming the same. Other example embodiments relate to a semiconductor device including a system on chip (SOC) and a method of forming the same.

2. Description of the Related Art

Usually, digital circuits and analog circuits are formed separately and integrated into one system. However, with the increase in the integration of semiconductor devices, a system on chip (SOC), in which digital circuits and analog circuits are integrated on one chip to improve operation speed, has been studied.

Digital circuits and analog circuits may be disposed on one semiconductor substrate. Noise generated at the digital circuits may flow into relatively high sensitive analog circuits through the substrate to deteriorate characteristics of an analog signal.

SUMMARY

Example embodiments provide a semiconductor device which may include a semiconductor substrate including a digital circuit region and an analog circuit region, a device isolation layer on the boundary between the digital circuit region and the analog circuit region, a conductive region adjacent to the side surface and the bottom surface of the device isolation layer, and a ground pad which is electrically connected to the conductive region and to which a ground voltage is applied.

Example embodiments provide a method of forming a semiconductor device which may include preparing a semiconductor substrate including a digital circuit region and an analog circuit region, forming a mask pattern on the semiconductor substrate; performing an etching process using the mask pattern as a mask to form a trench on the boundary between the digital circuit region and the analog circuit region; forming a conductive region on the side surface and the bottom surface of the trench, forming a device isolation layer to fill the trench, and forming a ground pad on the semiconductor substrate to be connected to the conductive region.

The device isolation layer may be provided to prevent the noise generated at the digital circuit region from flowing into the analog circuit region. The ground voltage may be applied to conductive region, so that noise generated at the digital circuit region may be absorbed and removed. As a result, the digital circuit region and the analog circuit region maybe included in one device reducing or removing noise from the digital circuit region so as to show better electrical performance.

BRIEF DESCRIPTION OF THE DRAWINGS

Example embodiments will be more clearly understood from the following detailed description taken in conjunction with the accompanying drawings. FIGS. 1-7D represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings. Example embodiments may, however, be embodied in many different forms and should not be construed as being limited to the embodiments set force herein. Rather, these embodiments are provided so that this disclosure will be thorough and complete, and will fully convey the scope of example embodiments to those skilled in the art.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present. Like reference numerals refer to like elements throughout the specification.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
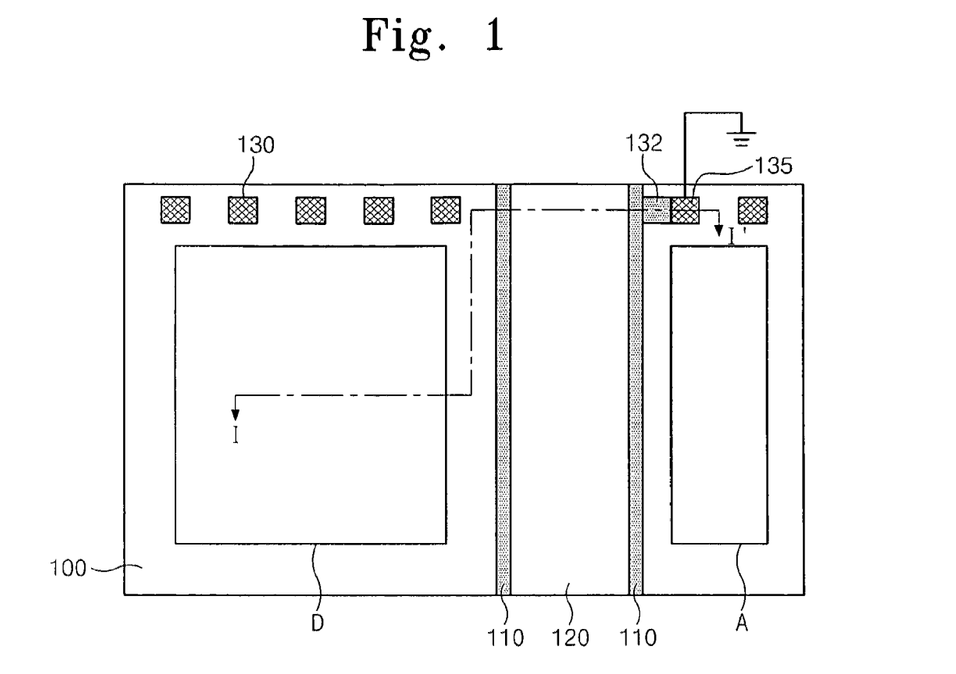
FIG. 1 is a plan view of a semiconductor device in accordance with example embodiments.
Figure 2:
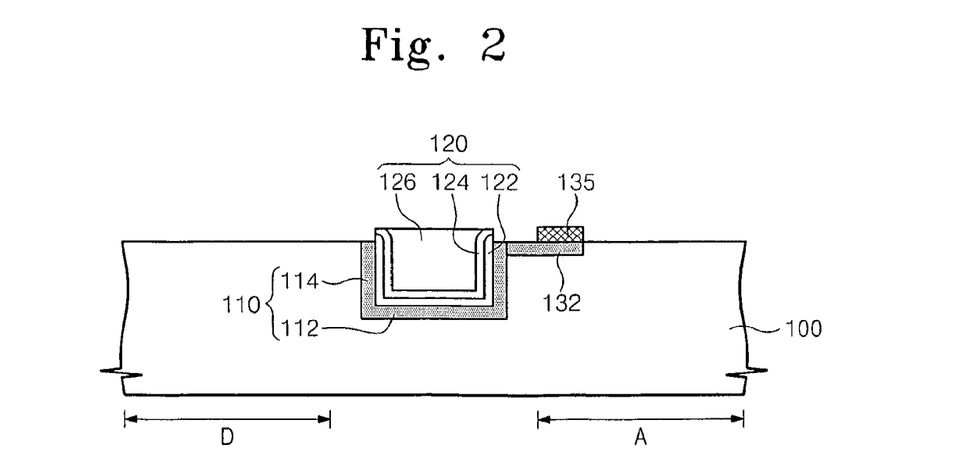
FIGS. 2-3 are cross-sectional views taken along the line I-I' of FIG. 1.
Figure 3:
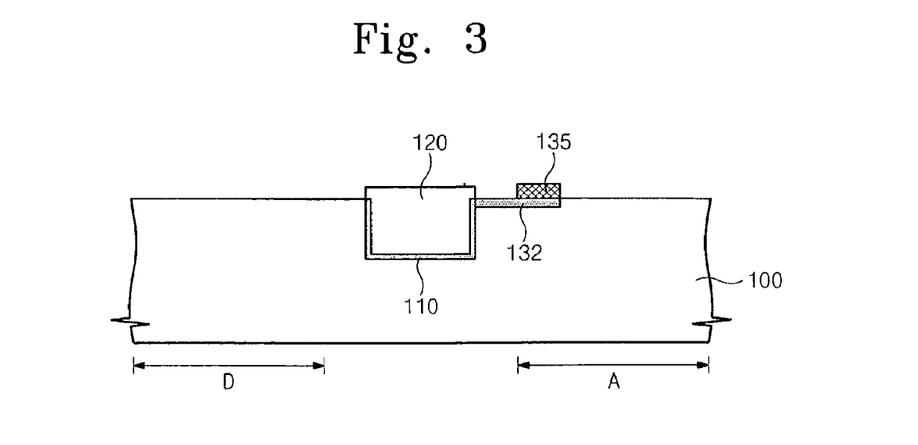

FIG. 1 is a plan view of a semiconductor device in accordance with example embodiments, and FIGS. 2-3 are cross-sectional views taken along the line I-I' of FIG. 1. Referring to FIG. 1, there is provided a semiconductor substrate 100 including a digital circuit region D and an analog circuit region A. A device isolation layer 120 may be provided on the boundary between the digital circuit region D and the analog circuit region A. The device isolation layer 120 may include a silicon oxide layer. The device isolation layer 120 may be provided to prevent the noise generated at the digital circuit region D from flowing into the analog circuit region A. A conductive region 110 may be provided to be adjacent to the side surface and the bottom surface of the device isolation layer 120. A bonding pad 130 and a ground pad 135 may be provided on the semiconductor substrate 100. A conductive pattern 132 may be provided at or on the semiconductor substrate 100 to be electrically connected to the conductive region 110. The conductive pattern 132 may include an impurity region or a metal layer. A ground voltage may be applied to the ground pad 135, and the ground pad 135 may be electrically connected to the conductive region 110 by the conductive pattern 132. The ground voltage may be applied to conductive region 110, so that noise generated at the digital circuit region may be absorbed and removed.

Referring to FIG. 2, the conductive region 110 may be in contact with the device isolation layer 120 and may be an impurity region in the semiconductor substrate 100. The impurity region 110 may include boron. The impurity region 110 may include a first impurity region 112 that is in contact with the bottom surface of the isolation layer 120 and a second impurity region 114 that is in contact with the side surface of the isolation layer 120. The isolation layer 120 may include a liner oxide layer 122 which is in contact with the impurity region 110, a liner nitride layer 124 on the liner oxide layer 122, and a gap-fill insulating layer 126. The liner oxide layer 122 may serve to cure etching damage of the semiconductor substrate 100. The liner nitride layer 124 may serve to reduce the stress between the gap-fill insulating layer 126 and the semiconductor substrate 100. Noise generated at the digital circuit region may be absorbed and removed by the isolation layer 120 and the impurity region 110.

Referring to FIG. 3, the conductive region 110 may be a metal pattern. The metal pattern 110 may include a metal silicide. The metal pattern 110 may be interposed between the device isolation layer 120 and the semiconductor substrate 100. Noise generated at the digital circuit region may be absorbed and removed by the metal pattern 110 and the device isolation layer 120.

Figure 4:
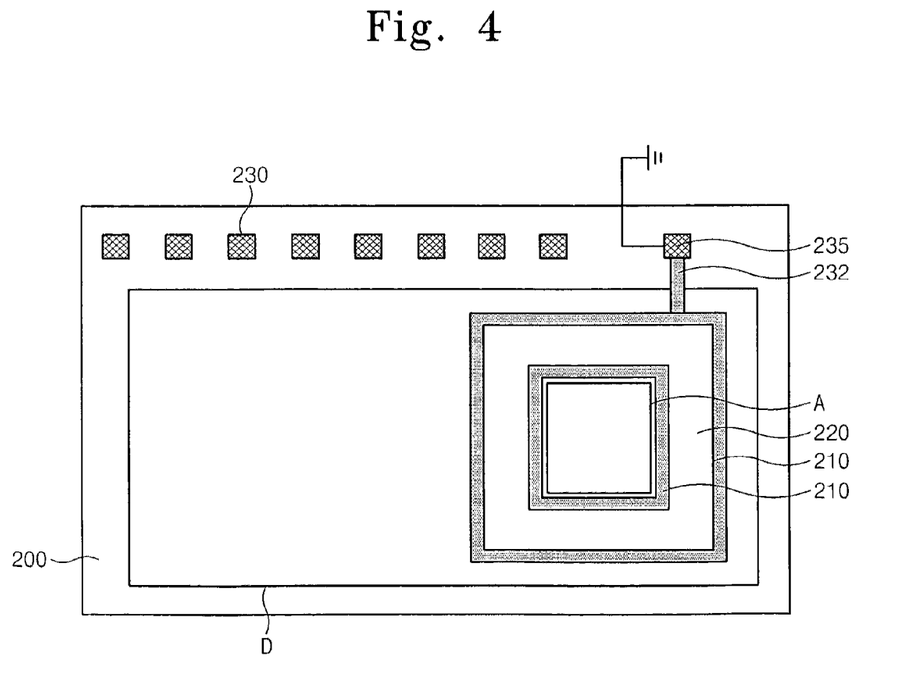
FIGS. 4-5 are plan views of semiconductor devices in accordance with example embodiments.

FIG. 4 is a plan view of a semiconductor device in accordance with example embodiments. Referring to FIG. 4, there is provided a semiconductor substrate 200 including a digital circuit region D and an analog circuit region A. The analog circuit region A may be disposed within the digital circuit region D. A device isolation layer 220 may be provided to surround the edge of the analog circuit region A. A conductive region 210 may be provided on the side surface and the bottom surface of the isolation layer 220. Bonding pads 230 and a ground pad 235 may be provided on the semiconductor substrate 200. A ground voltage may be applied to the ground pad 235. The conductive region 210 may be electrically connected to the ground pad 235 on the semiconductor substrate 200 by a conductive pattern 232. Noise flowing into the analog circuit region A may be absorbed and removed by the isolation layer 220 and the conductive region 210.

Figure 5:
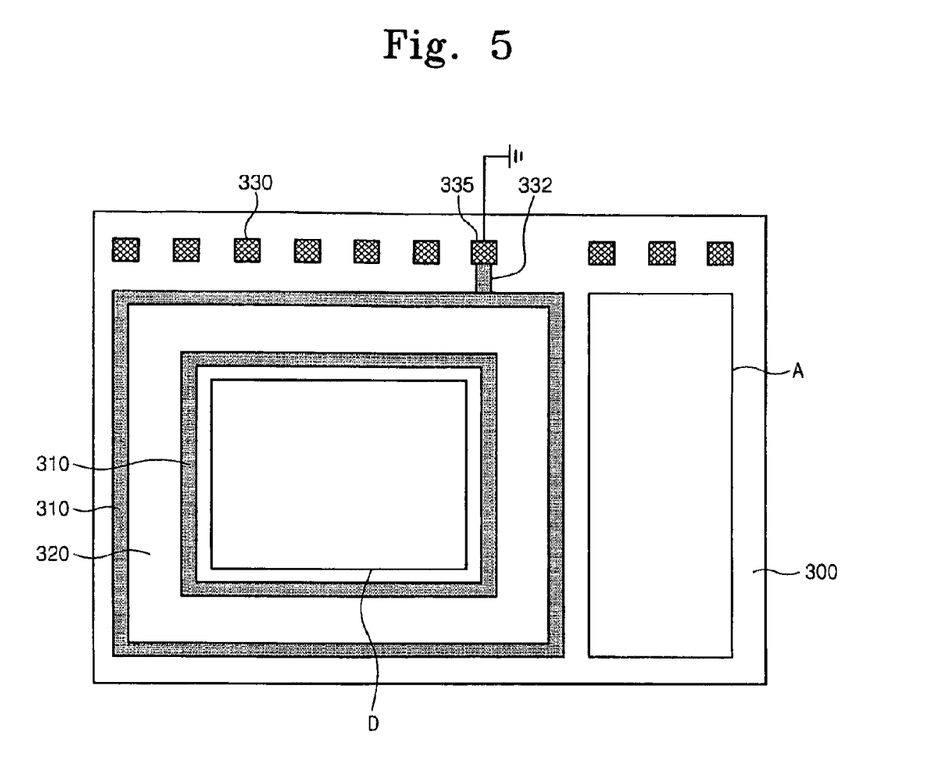

FIG. 5 is a plan view of a semiconductor device in accordance with example embodiments. Referring to FIG. 5, there is provided a semiconductor substrate 300 including a digital circuit region D and an analog circuit region A. An isolation layer 320 may be provided to surround the edge of the digital circuit region D. A conductive region 310 may be provided on the side surface and the bottom surface of the isolation layer 320. Bonding pads 330 and a ground pad 335 may be provided on the semiconductor substrate 300. A ground voltage may be applied to the ground pad 335. The conductive region 310 may be electrically connected to the ground pad 335 on the semiconductor substrate 300 by the conductive pattern 332. Noise generated at the digital circuit region D may be absorbed and removed by the isolation layer 320 and the conductive region 310.

Figure 6A:
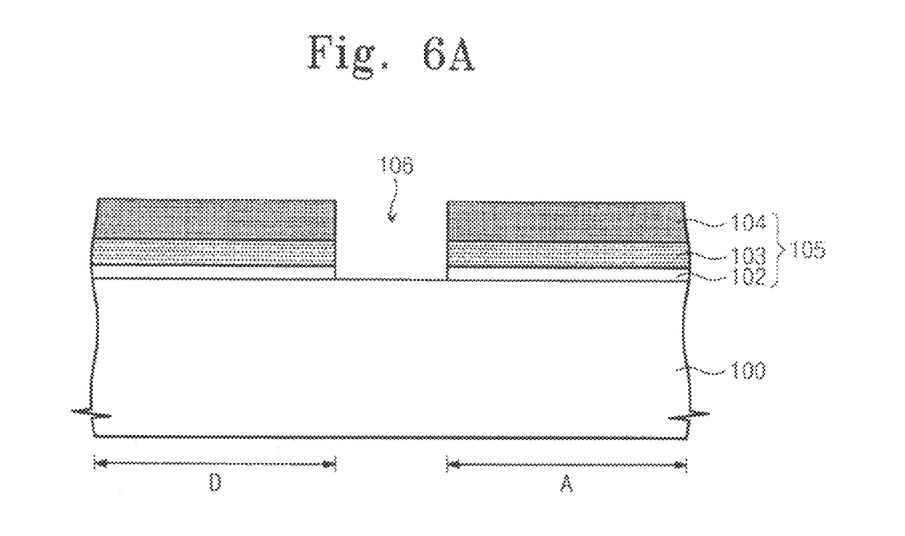
FIGS. 6A-6D are cross-sectional views illustrating a method of forming a semiconductor device in accordance with example embodiments.

FIGS. 6A-6D are cross-sectional views illustrating a method of forming semiconductor device in accordance with example embodiments. Referring to FIG. 6A, there is provided a semiconductor substrate 100 including a digital circuit region D and an analog circuit region A. A mask pattern 105 may be provided on the semiconductor substrate 100. The mask pattern may include a pad oxide pattern 102 on the semiconductor substrate 100, a silicon nitride pattern 103 on the pad oxide pattern 102, and a photoresist pattern 104 on the silicon nitride pattern 103. An opening 106 formed on the mask pattern 105 may be disposed on the boundary between the digital circuit region and the analog circuit region.

Figure 6B:
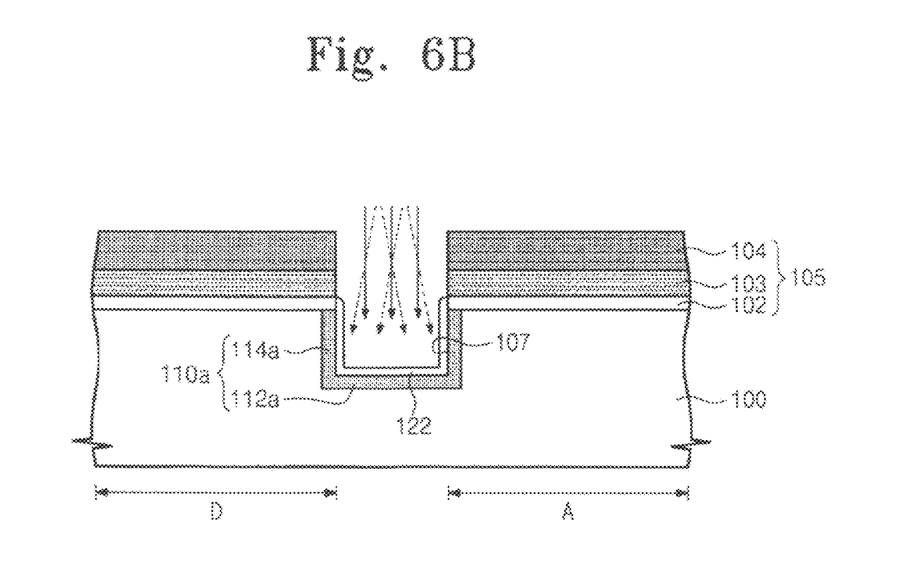

Referring to FIG. 6B, an etching process may be performed using the mask pattern 105 as a mask to form a trench 107 on the semiconductor substrate 100. A liner oxide layer 122 may be formed on the side surface and the bottom surface of the trench 107. The liner oxide layer 122 may be formed by means of a heat oxidation process. The liner oxide layer 122 may cure etching damage of the semiconductor substrate 100 and act as a screen oxide layer in an ion implantation process. An impurity region 110a may be formed on the side surface and the bottom surface of the trench 107. Forming the impurity region 110a may include performing an ion implantation process using the mask pattern as a mask to form a first impurity region 112a on the bottom surface of the trench 107 and performing an oblique ion implantation process using the mask pattern as a mask to form a second impurity region 114a on the side surface of the trench 107.

Figure 6C:
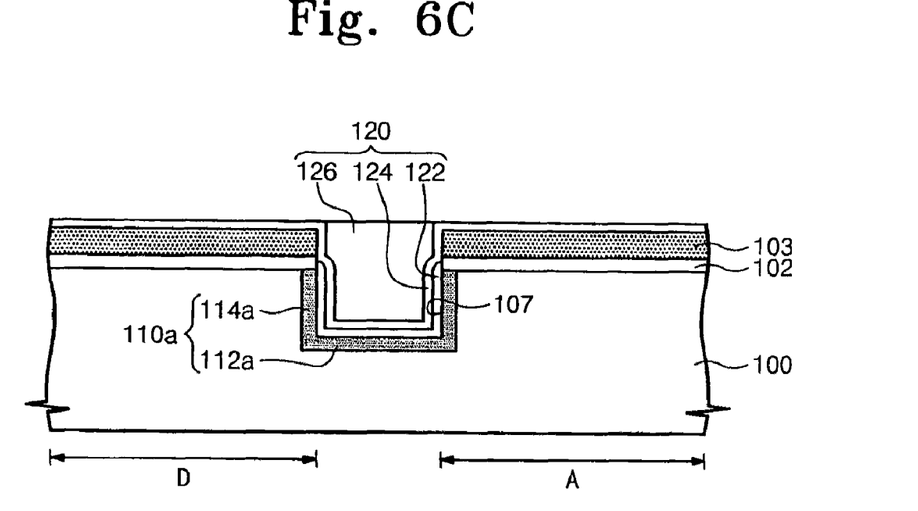

Referring to FIG. 6C, the photoresist pattern 104 may be removed. A liner nitride layer 124 may be formed on the liner oxide layer 122 and the silicon nitride pattern 103. The liner nitride layer 124 may be formed by means of chemical vapor deposition (CVD). A gap-fill insulating layer 126 may be formed to fill the trench 107. The gap-fill insulating layer 126 may be formed by means of high-density plasma chemical vapor deposition (HDPCVD). Thus, the isolation layer 120 may include the liner oxide layer 122, the liner nitride layer 124, and the gap-fill insulating layer 126.

Figure 6D:
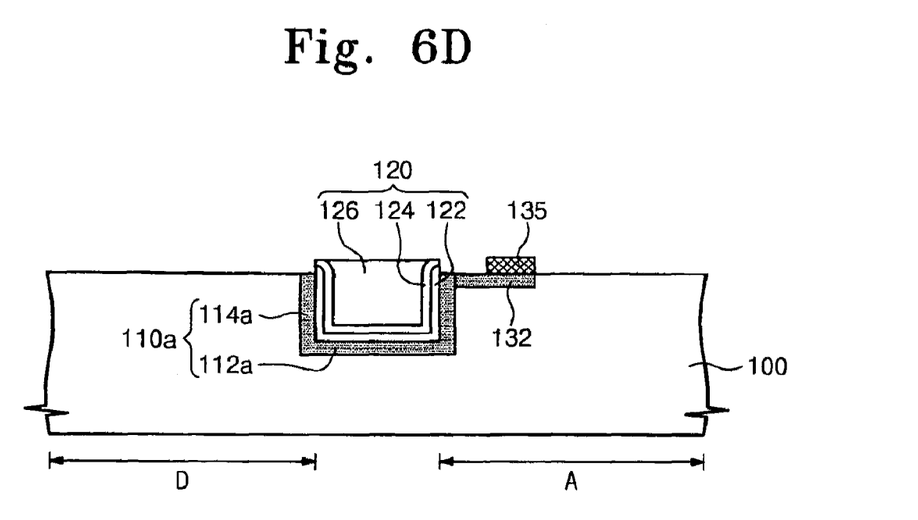

Referring to FIG. 6D, the silicon nitride pattern 103 and the pad oxide pattern 102 may be removed. A conductive pattern 132 may be formed to be connected to the impurity region 110. The conductive pattern 132 may be a metal layer on the semiconductor substrate 100 or an impurity region formed by means of an ion implantation process. A ground pad 135 may be formed on the semiconductor substrate 100 to be in contact with the conductive pattern 132. A ground voltage may be applied to the ground pad 135. Noise generated at the digital circuit region D may be absorbed and removed by the isolation layer 120, the impurity region 110, and the ground voltage.

Figure 7A:
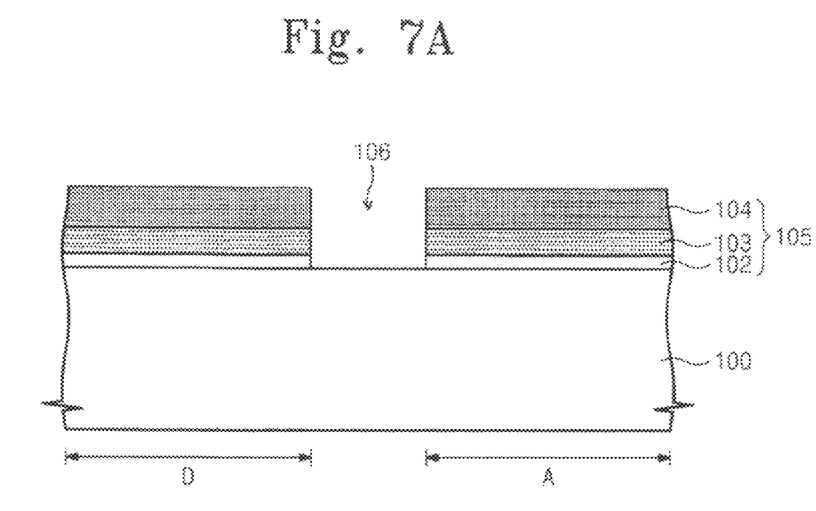
FIGS. 7A-7D are cross-sectional views illustrating a method of forming a semiconductor device in accordance with example embodiments.

FIGS. 7A-7D are cross-sectional views illustrating a method of forming semiconductor device in accordance with example embodiments. Referring to FIG. 7A, there is provided a semiconductor substrate 100 including a digital circuit region D and an analog circuit region A. A mask pattern 105 may be provided on the semiconductor substrate 100. The mask pattern may include a pad oxide pattern 102 on the semiconductor substrate 100, a silicon nitride pattern 103 on the pad oxide pattern 102, and a photoresist pattern 104 on the silicon nitride pattern 103. An opening 106 formed on the mask pattern 105 may be disposed on the boundary between the digital circuit region and the analog circuit region.

Figure 7B:
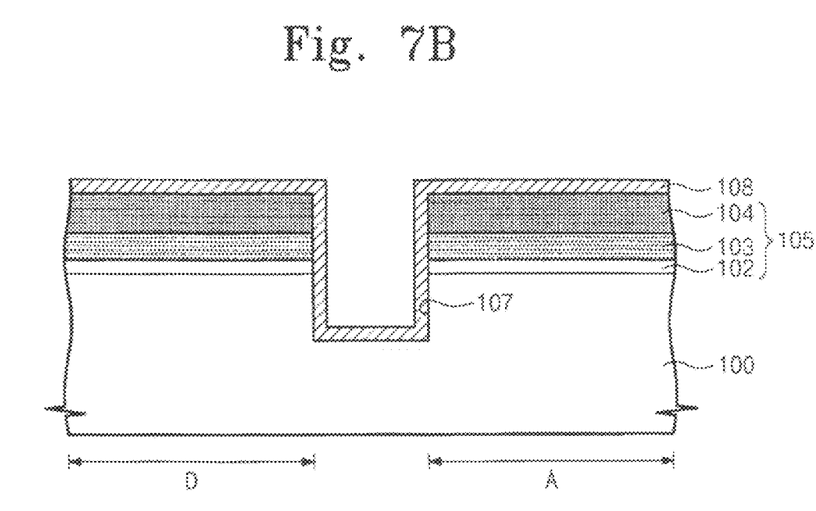
Figure 7C:
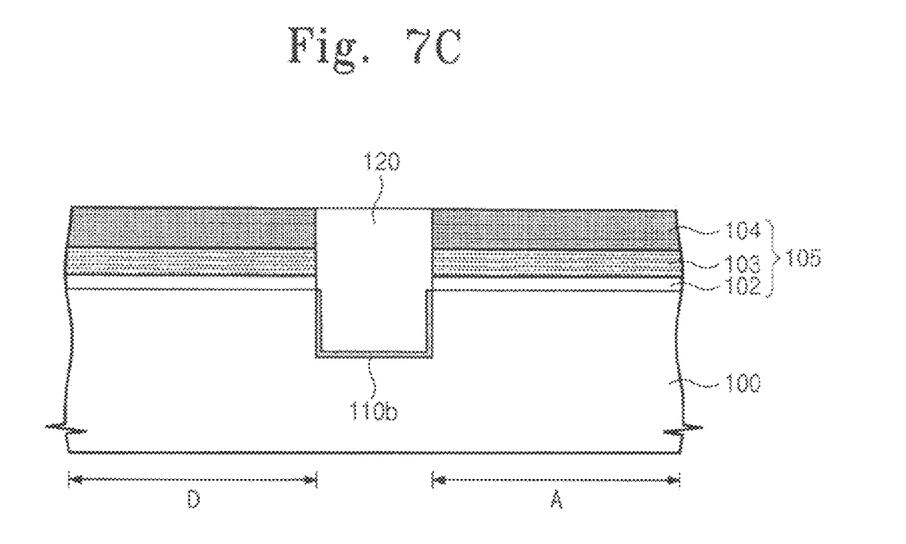

Referring to FIG. 7B, an etching process may be performed using the mask pattern 105 as a mask to form a trench 107 on the semiconductor substrate 100. A metal layer 108 may be formed on the side surface and the bottom surface of the trench 107. Referring to FIG. 7C, an annealing process may be performed on the semiconductor substrate 100 to form a metal silicide layer 110b. A metal layer, which does not react with the semiconductor substrate 100, may be removed. The metal silicide layer 110b may be defined as a metal pattern. A device isolation layer 120 may be formed to fill the trench 107. The device isolation layer 120 may be formed by means of high-density plasma chemical vapor deposition (HDPCVD).

Figure 7D:
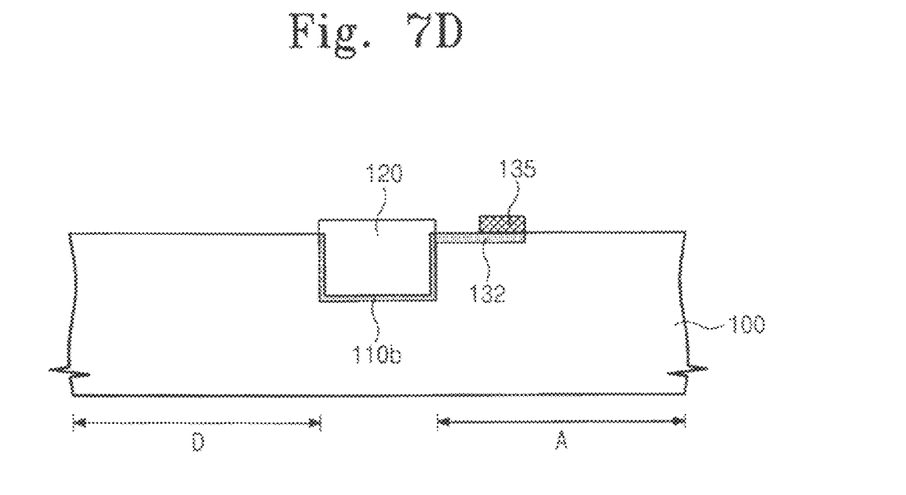

Referring to FIG. 7D, a conductive pattern 132 may be formed on the semiconductor substrate 100 to be connected to the metal pattern 110b. A ground pad 135 may be formed on the semiconductor substrate to be connected to the conductive pattern 132. A ground voltage may be applied to the ground pad 135. Noise generated at the digital circuit region D may be absorbed and removed by the isolation layer 120, the metal pattern 110b, and the ground voltage.

While example embodiments have been particularly shown and described with reference to embodiments thereof, it should not be construed as being limited to the embodiments set forth herein but as an example. Those skilled in this art would know that example embodiments may be modified in various ways, for example, the constitute elements and structure of the thin film transistor. Also, the thin film transistor may be applied to not only liquid crystal display apparatuses or organic light emitting display apparatuses, but also memory devices and logic devices. Therefore, the scope of example embodiments is defined not by the detailed description of example embodiments, but defined by the appended claims.

What is claimed is:
1. A semiconductor device comprising:
a semiconductor substrate including a digital circuit region and an analog circuit region;
a device isolation layer on the boundary between the digital circuit region and the analog circuit region;
a conductive region adjacent to a side surface and a bottom surface of the device isolation layer; and
a ground pad electrically connected to the conductive region and to which a ground voltage is applied,
wherein the device isolation layer fills a trench in the semiconductor substrate, and
wherein the conductive region is continuously formed along sidewalls and a bottom surface of the trench.

2. The semiconductor device of claim 1, wherein the conductive region includes an impurity region on the semiconductor substrate and being in contact with the device isolation layer.

3. The semiconductor device of claim 2, wherein the impurity region includes boron.

4. The semiconductor device of claim 1, wherein the conductive region includes a metal pattern.

5. The semiconductor device of claim 4, wherein the metal pattern includes metal silicide.

6. The semiconductor device of claim 4, wherein the metal pattern is between the device isolation layer and the semiconductor substrate.

7. The semiconductor device of claim 1, wherein the device isolation layer surrounds the edge of the analog circuit region.

8. The semiconductor device of claim 1, wherein the device isolation layer surrounds the edge of the digital circuit region.

9. The semiconductor device of claim 1, wherein the device isolation layer includes a liner oxide layer being in contact with the semiconductor substrate and a liner nitride layer on the liner oxide layer.

10. A method of manufacturing a semiconductor device comprising:
preparing a semiconductor substrate including a digital circuit region and an analog circuit region;
forming a mask pattern on the semiconductor substrate;
performing an etching process in the semiconductor substrate using the mask pattern as a mask to form a trench in the semiconductor substrate and on the boundary between the digital circuit region and the analog circuit region;

forming a conductive region on a side surface and a bottom surface of the trench;

forming an device isolation layer to fill the trench in the semiconductor substrate; and forming a ground pad on the semiconductor substrate to be electrically connected to the conductive region, wherein the forming a conductive region includes continuously forming the conductive region along sidewalls and a bottom surface of the trench.

11. The method of claim 10, wherein forming the conductive region includes:

performing an ion implantation process using the mask pattern as a mask to form a first impurity region on the bottom surface of the trench; and performing an oblique ion implantation process using the mask pattern as a mask to form a second impurity region on the side surface of the trench.

12. The method of claim 11, wherein forming the device isolation layer includes:

forming a liner oxide layer on the trench; and forming a liner nitride layer on the liner oxide layer.

13. The method of claim 10, wherein the conductive region is formed of a metal pattern.

14. The method of claim 13, wherein forming the metal pattern includes:

forming a metal layer on the trench; and performing an annealing process on the substrate to form a metal silicide layer.

15. The method of claim 10, wherein the trench is formed to surround the edge of the analog circuit region.

16. The method of claim 10, wherein the trench is formed to surround the edge of the digital circuit region.

17. The method of claim 10, wherein the mask pattern includes a pad oxide pattern on the substrate, a silicon nitride pattern on the pad oxide pattern, and a photoresist pattern on the silicon nitride pattern.

18. The semiconductor device of claim 1, wherein the device isolation layer is surrounded by the conductive region when viewed from a plan view.

* * * * *